United States Patent
Wilner

(10) Patent No.: US 6,327,672 B1
(45) Date of Patent: Dec. 4, 2001

(54) MULTIPLE DRIVE FAILURE TOLERANT RAID SYSTEM

(75) Inventor: Alden Wilner, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/224,524

(22) Filed: Dec. 31, 1998

(51) Int. Cl.[7] .............................. G06F 11/07; G06F 11/08
(52) U.S. Cl. ................................. 714/6; 711/114
(58) Field of Search ...................................... 714/4–7, 764, 714/723; 711/114; 710/74; 360/31, 55; 369/94

(56) References Cited

U.S. PATENT DOCUMENTS

| | | | |
|---|---|---|---|
| 4,989,206 | * 1/1991 | Dunphy, Jr. et al. | . |
| 5,301,297 | 4/1994 | Menon et al. | 395/425 |
| 5,331,646 | 7/1994 | Krueger et al. | 371/40.1 |
| 5,477,653 | 12/1995 | Altmayer | . |
| 5,479,653 | 12/1995 | Jones | 395/182.03 |
| 5,485,571 | 1/1996 | Menon | 395/182.05 |
| 5,499,253 | 3/1996 | Lary | 371/40.1 |
| 5,513,192 | 4/1996 | Janku et al. | 371/50.1 |
| 5,544,339 | 8/1996 | Baba | 395/441 |
| 5,579,475 | 11/1996 | Blaum et al. | 395/182.05 |
| 6,154,853 | * 11/2000 | Kedem | . |

OTHER PUBLICATIONS

AC&NC Raid Technology; http://www.raid-storage.com/raid6.html (2 pages), 1997.
AC&NC Raid Technology; http://www.ocnc.com/raid.html (6 pages), 1997.
Computer Architecture A Quantitative Approach 1996—Author(s)—David A. Patterson, John Hennessy.
A Case for Redundant Arrays of Inexpensive Disks (RAID) 1987—Author(s)—David A. Patterson, Garth Gibson, Randy H. Katz.

* cited by examiner

Primary Examiner—Gopal C. Ray
(74) Attorney, Agent, or Firm—Townsend and Townsend and Crew, L.L.P.

(57) ABSTRACT

A method and apparatus for providing data backup in a computer system. Check information can be calculated and stored on a sequential arrangement of data drives such that the loss of a single data drive does not impair the reading or writing of information on that data drive. Should more than one data drive fail or several drives fail, data can still be resurrected by chaining back through the arrangement of drives to calculate lost information. An optimum number of drives can be determined when the known number of data drives and known number of check drives and known number of check drives associated with each data drive is known. Should a data drive fail, a system for re-establishing a new data drive out of the existing check drives can be implemented.

27 Claims, 10 Drawing Sheets

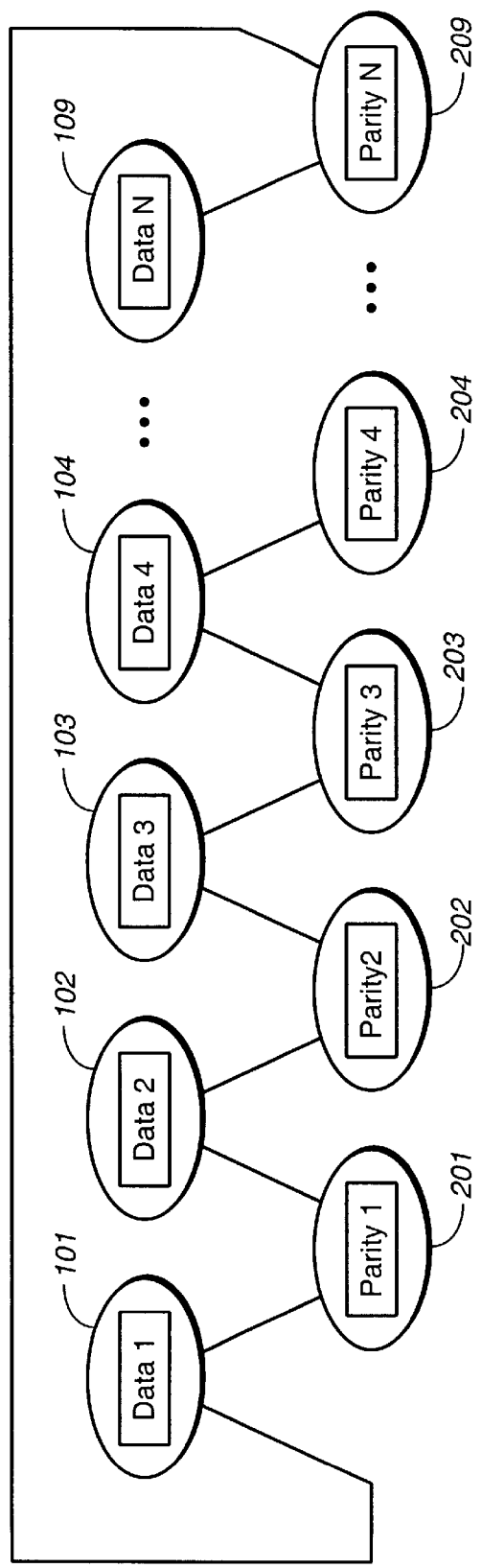
FIG._1

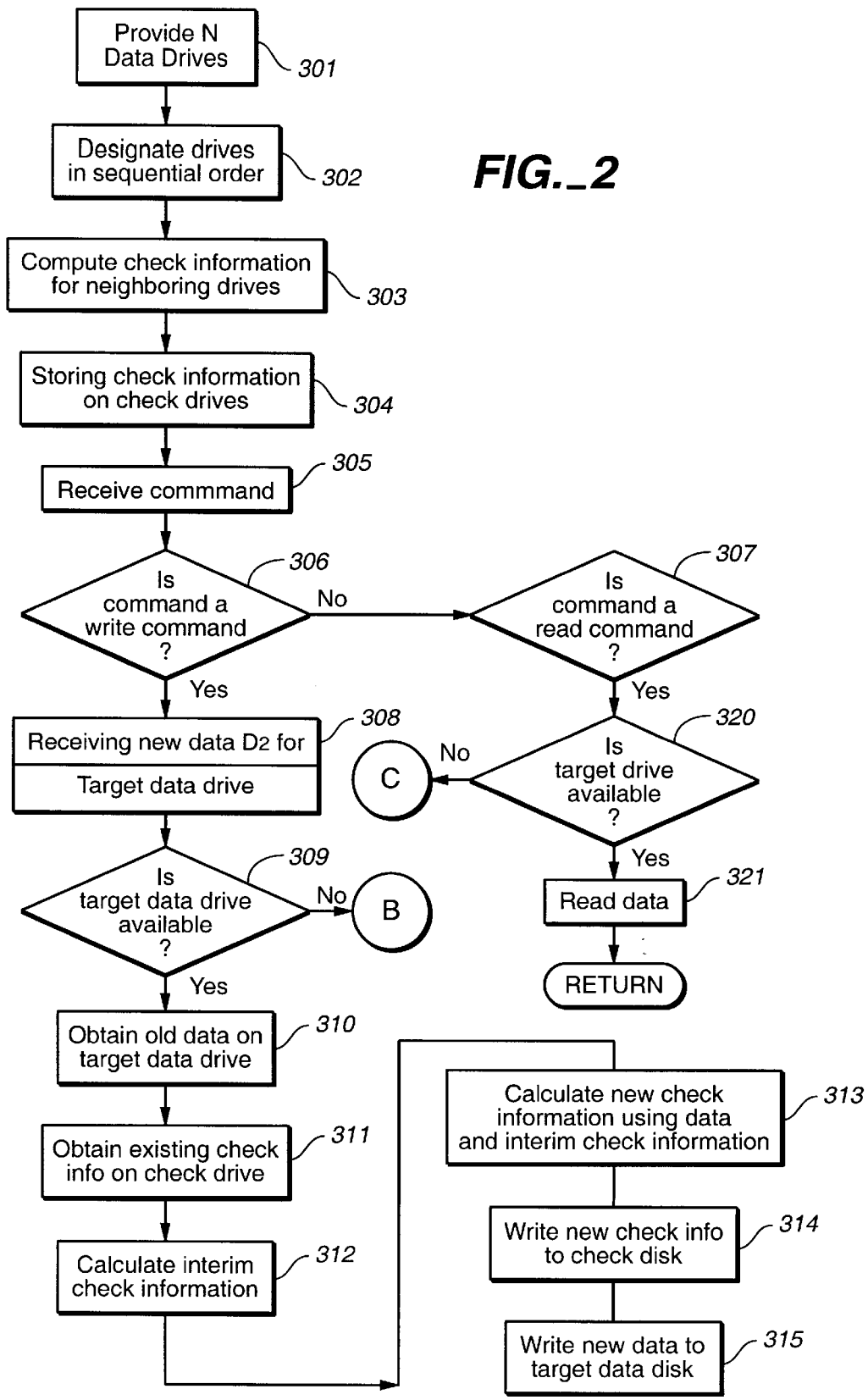
FIG._2

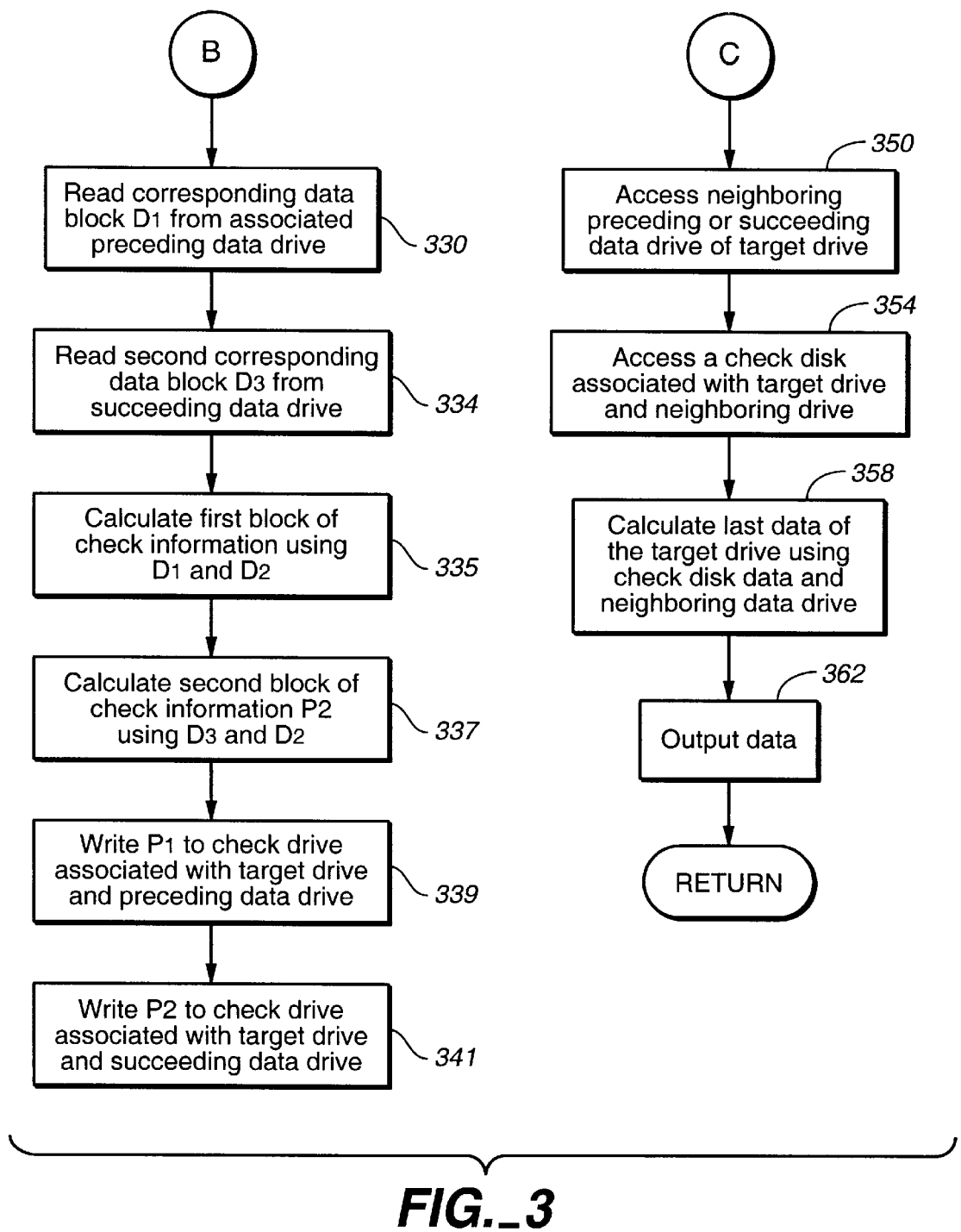
FIG._3

FIG._4
FIG._4A
FIG._4B
FIG._4A
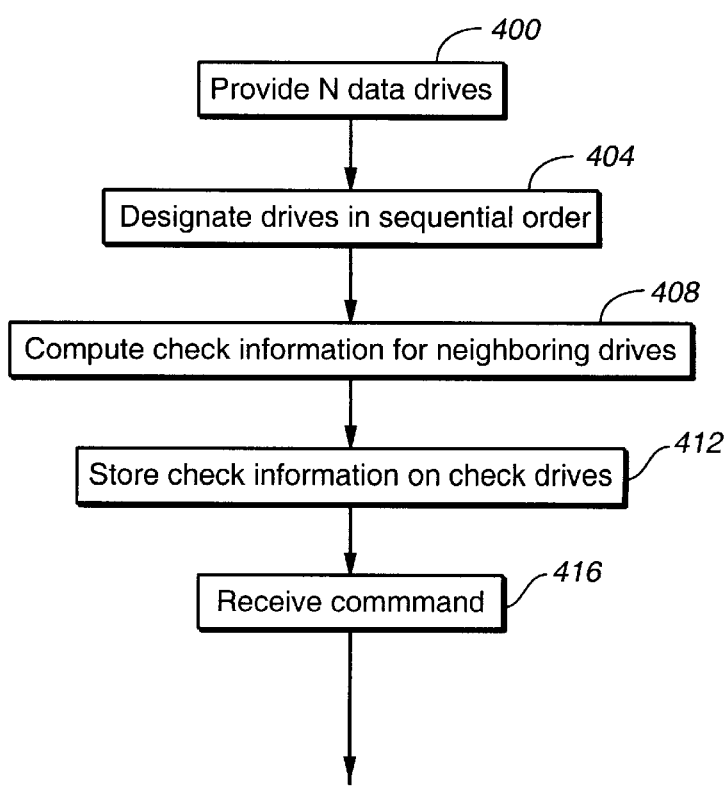

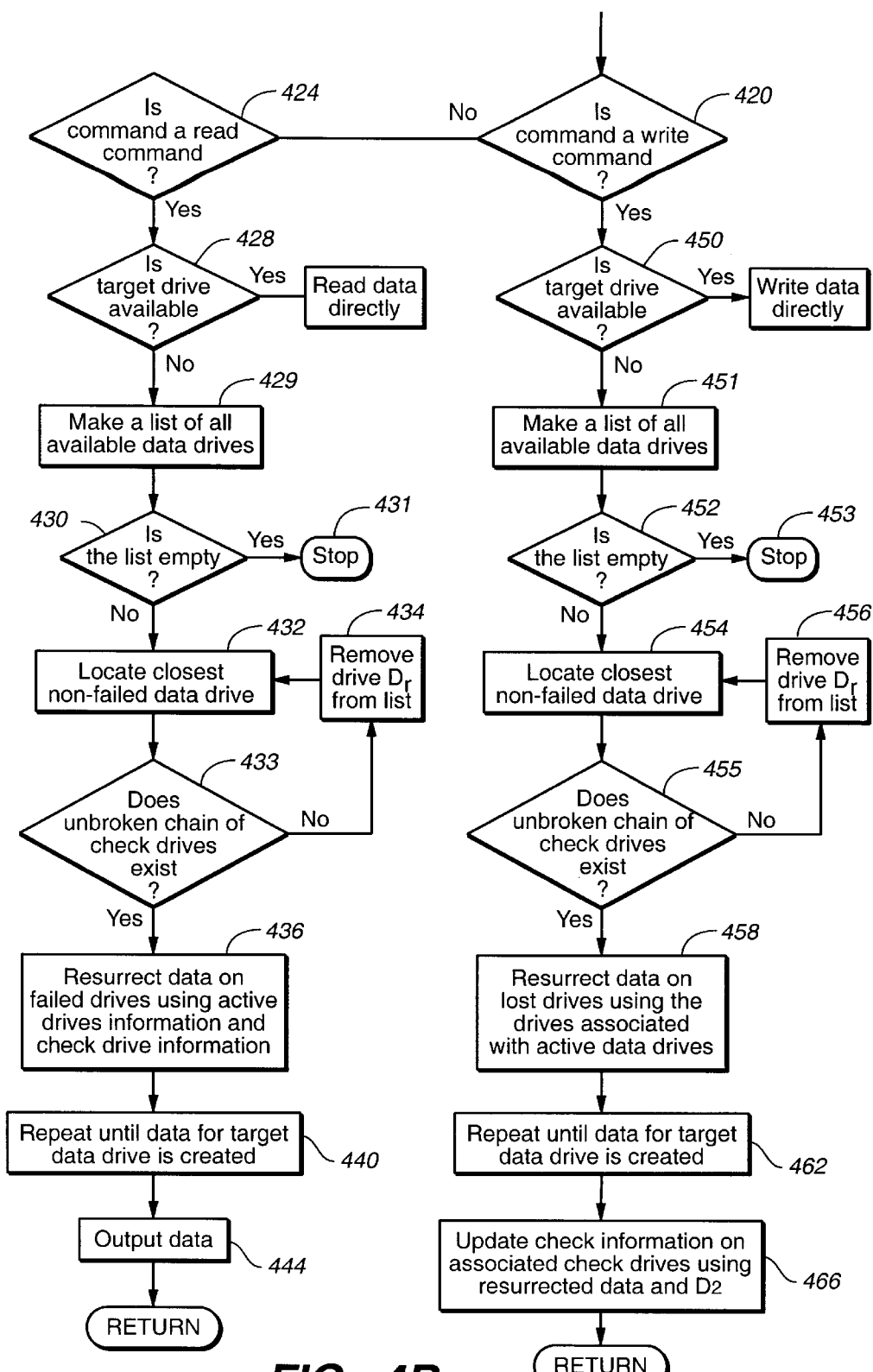
FIG._4B

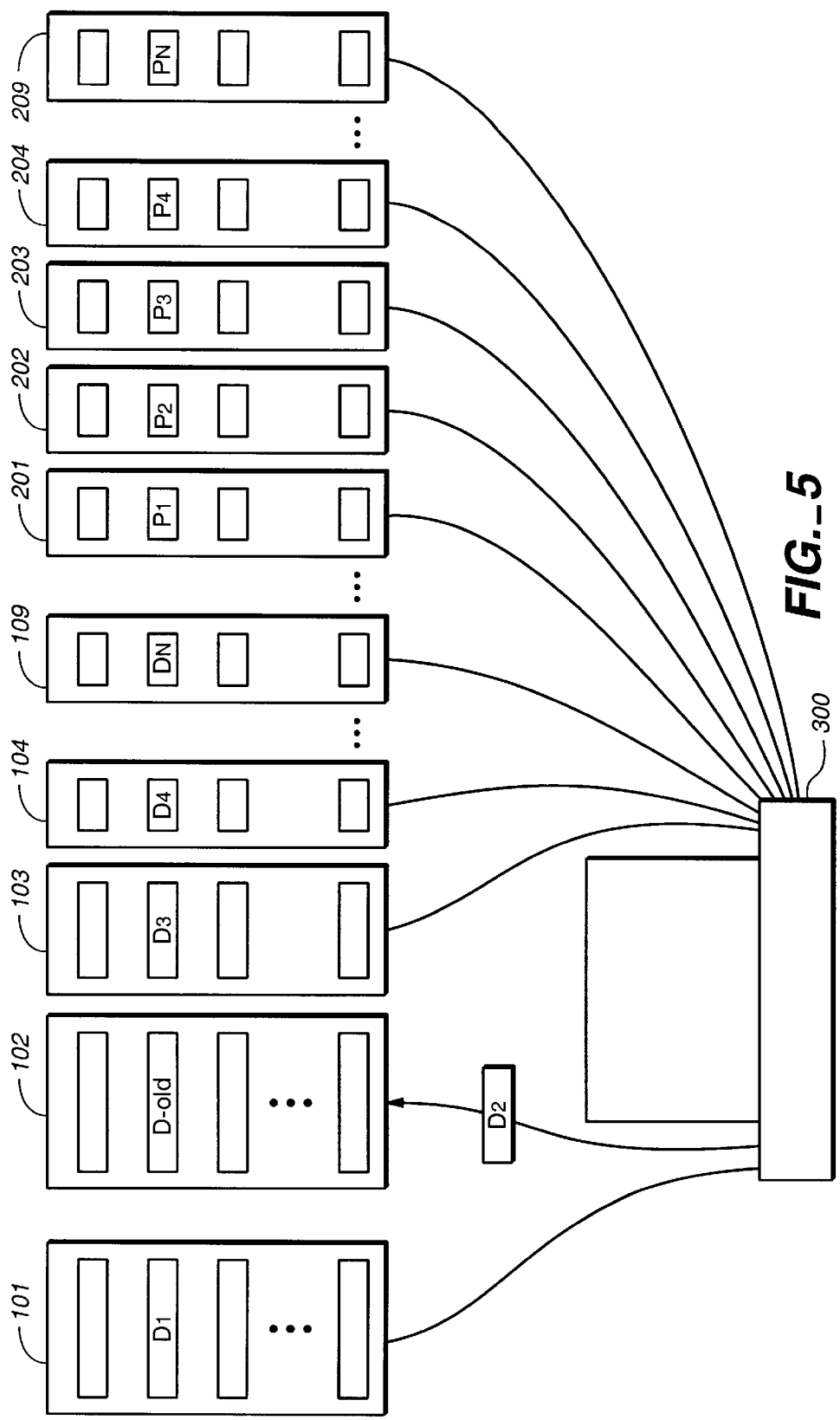
FIG._5

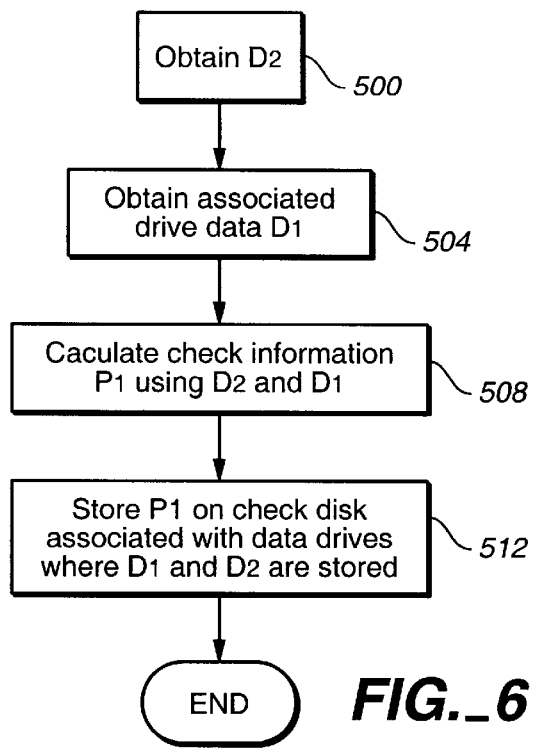
FIG._6
| P1 | P2 | P3 | P4 | P5 | P6 |
|----|----|----|----|----|----|
| D1 | D1 |    |    |    |    |
| D2 |    | D2 |    |    |    |
| D3 |    |    | D3 |    |    |
| D4 |    |    |    | D4 |    |
| D5 |    |    |    |    | D5 |
|    | D6 | D6 |    |    |    |
|    | D7 |    | D7 |    |    |
|    | D8 |    |    | D8 |    |
|    | D9 |    |    |    | D9 |
|    |    | D10 | D10 |   |    |
|    |    | D11 |    | D11 |   |
|    |    | D12 |    |    | D12 |
|    |    |    | D13 | D13 |   |
|    |    |    | D14 |    | D14 |
|    |    |    |    | DD | DD |
FIG._7

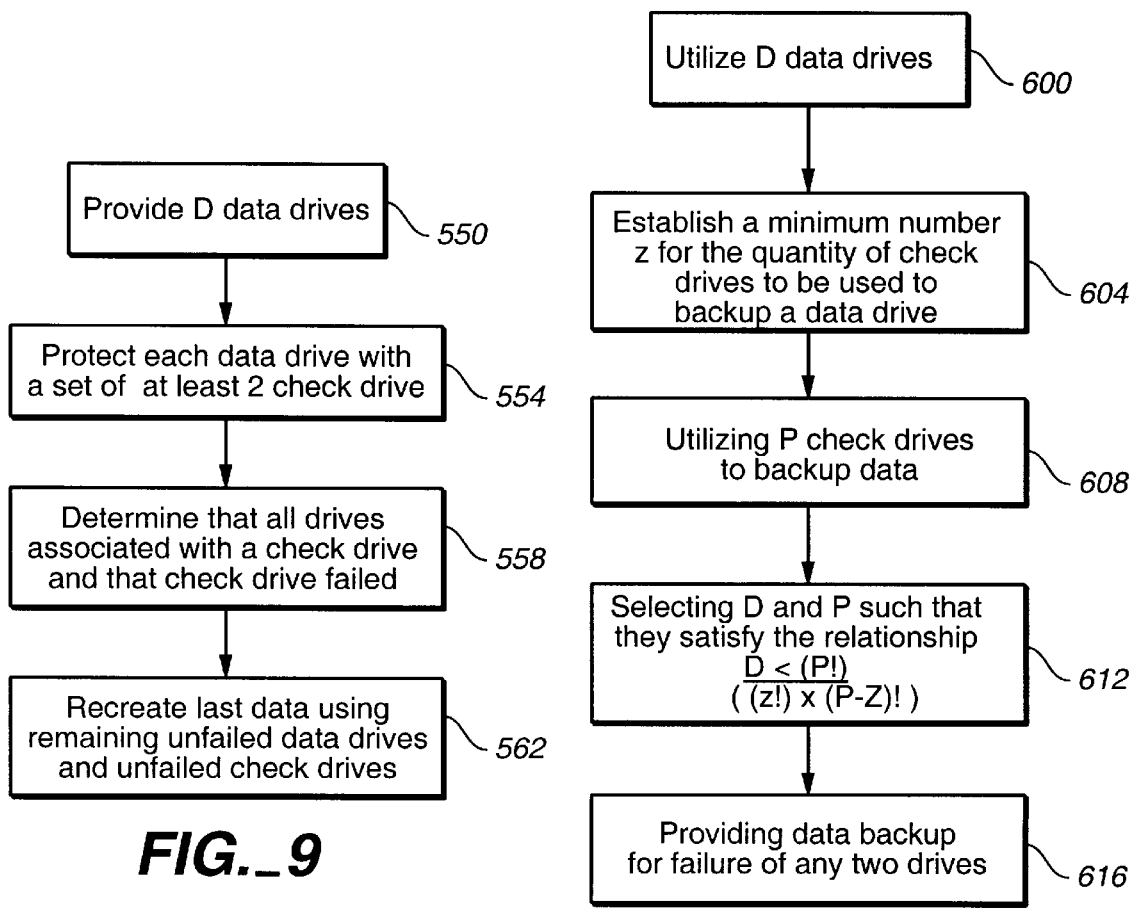

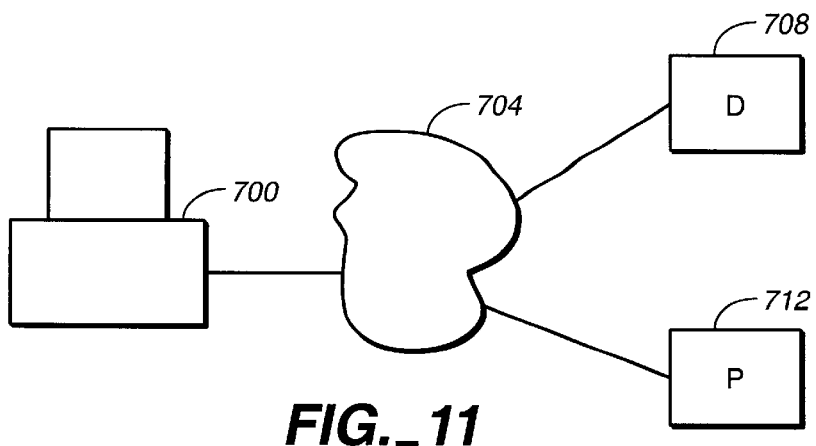
FIG._11
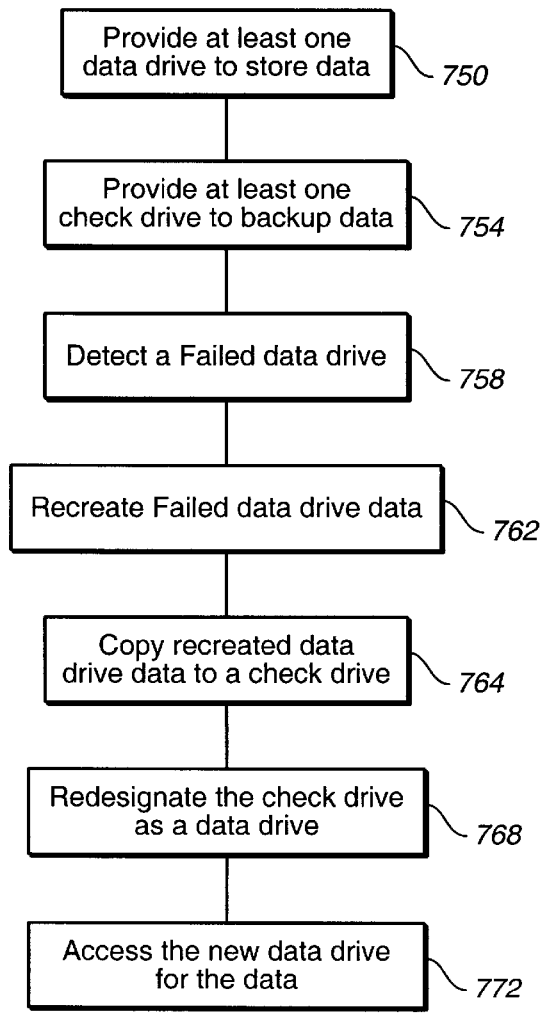
FIG._12

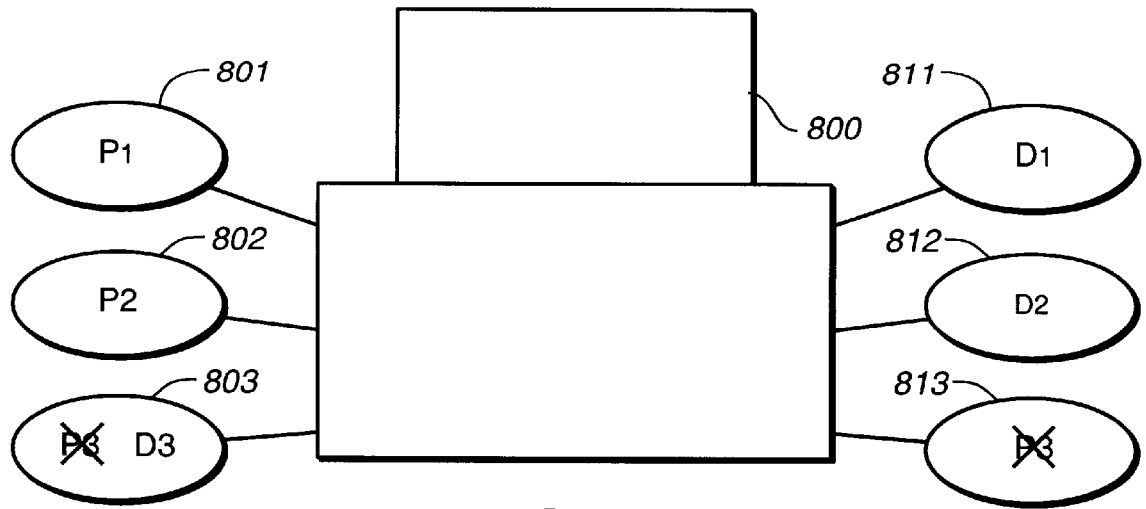
FIG._13
1. ∀n,
    ∃ x, y, x ≠ y, such that
        Dn → Px and
        Dn → Py
2. ∀n, m, n ≠ m
    ∃ x, y, x ≠ y, such that
        Dn → Px and not Dm → Px
        Dm → Py and not Dn → Py
FIG._14

MULTIPLE DRIVE FAILURE TOLERANT RAID SYSTEM

BACKGROUND OF THE INVENTION

This invention relates generally to the area of computer data storage protection system. More specifically, this invention relates to the area of computer storage protection known as Redundant Array of Inexpensive Disk (RAID) Systems.

A variety of systems have been developed in the past that allow one to protect stored data in what is commonly referred to as a Redundant Array of Inexpensive Disks (RAID). This RAID technology has utilized several forms in the past. For example, a RAID zero system breaks data down into blocks and writes the blocks to separate disk drives. In this approach, if a single drive fails, all data that was stored on that drive will be lost. Therefore, when a drive is lost, only a portion of the data is lost. This is not a true RAID system, because it is not a fault tolerant system. Nevertheless, the data transfer capacity and I/O rate is very high for both reads and writes.

A second version of RAID is known as RAID 1 or mirroring. RAID 1 involves a mirroring or replicating of data on one drive to a duplicate drive. In this way, an exact duplicate of the data on a disk drive is accomplished on a redundant drive. As one can imagine, this is a very expensive way to back up data. In addition, the I/O rate for writes is slower than that of a single disk system. RAID 1 is frequently combined with RAID zero so that data is striped across pairs of drives. This approach can tolerate multiple drive failures, provided the failed drives do not compose a mirrored pair. However, if both drives in a mirrored pair fail, the data will be lost.

Yet another version of RAID technology is commonly referred to as RAID 2. RAID 2 utilizes a Hamming error correction code to protect data stored on the data drives. In this way, data distributed over several different disk drives can be protected through a parallel storage of error correction code information stored on additional drives. One drawback to RAID 2 is that it requires a very high ratio of error correction code drives to data drives.

Yet another RAID technology that has been proposed is RAID 3. RAID 3 subdivides the data blocks and writes those subdivisions onto separate data drives. This is commonly referred to as striping the data across the data drives. In addition to the striping, parity information is calculated and stored on a parity drive. Therefore, for every stripe of data, a corresponding block of parity information can be stored. In this manner, RAID 3 allows a lost drive of stored information to be recovered utilizing the remaining drives and the parity information. However, if two drives fail, e.g., a parity drive and a data drive, the entire storage system fails.

Another RAID technology is commonly referred to as RAID 4. RAID 4 is similar to RAID 3 except that rather than striping the data across several different disk drives, a block of data is stored on a single disk drive and additional blocks of data are stored on the additional disk drives. Then, parity information is calculated using the several independent blocks of information stored on the various disk drives. Again, as was the case in RAID 3, if a disk drive fails, the remaining disk drives and the drive that contains the parity information can be utilized to recover lost data that was stored on the failed drive. Once again, however, if any two drives should fail, then the entire system fails.

RAID 5 is yet another RAID technology that is utilized to protect data. RAID 5 uses parity information in addition to the distribution of blocks of data across several disk drives. However, in contrast to RAID 4 which stored all of the parity information on a single disk drive, RAID 5 spreads the parity information across the data drives themselves. In this way, parity information for a first row of information can be stored in the first row of the last data drive. Parity information for a second row of data can be stored in the second row of the second to the last data drive and so forth. This technique distributes the parity information across several data drives but the manner of recovering lost data with a parity scheme remains the same. Once again, loss of any two drives causes the entire storage system to fail.

RAID 6 is essentially an extension of RAID 5. It allows two parity calculations to be made for the data stored on the various data drives. For example, in RAID 6, two sets of parity information can be calculated for blocks of data stored in an array. Parity information can be calculated for each column of data blocks as well as each row of data blocks. Both of these sets of parity information can be distributed on the various disk drives as was done in the RAID 5 configuration. RAID 6 requires extensive controller overhead, however, in order to compute the parity addresses distributed throughout the array of drives.

As can be seen from the various RAID techniques that have been used in the past, none has been a perfect solution to the variety of protection needs that exist in the computer industry. Depending on the application of the data, there will be varying needs for protecting data. For example, some data will be so important that a very reliable fault tolerant system needs to be in place to protect the data. A system that is simple to implement and involves an uncomplicated design is preferable, as well.

SUMMARY OF THE INVENTION

The present invention provides an inventive method and apparatus to overcome problems of existing data backup systems. Various embodiments of the invention serve to protect data when more than one drive fails. In addition, one embodiment of the invention helps to allow a designer to determine an optimum number of drives that can be used in various data protection schemes. A designer can calculate the maximum number of data drives that can be protected by a given number of check drives. In addition, one embodiment of the invention permits a recovery of data by a method that allows chaining back through failed drives. Furthermore, another embodiment of the invention allows a check drive to be converted into a data drive so as to enhance data recovery and storage when a data drive fails or is unaccessible.

The invention can utilize an array of redundant data drives to accomplish data storage. In a unique manner, the invention can employ at least two check disks on which check information—such as parity information—can be stored. In this manner, the check drives can allow at least two data drives to fail and still permit the recovery of the information stored on the failed data drives.

A unique configuration of the invention provides at least two check drives per data drive in a chained configuration. In this configuration, a loss of more than one data drive allows the data to be recovered by chaining back to recalculate a failed drive using the two check drives and existing data drives that have not failed. In this manner, the data for each failed drive can be determined and then again utilized to calculate the data for a failed drive that neighbors the first failed drive. This chain configuration therefore allows numerous data and parity drives to fail while still permitting reconstruction of the data on the failed drives.

Another embodiment of the invention utilizes or permits calculation of the number of data drives that can be protected with a given number of check drives and a known number of failed drives. In this manner, the amount of check information overhead can be decreased to the least amount necessary to accomplish the backup function.

In another embodiment of the invention, a failed data drive can be replaced in the backup system by an existing check drive. The check drive then becomes a data drive and the lost data can be stored on this new data drive. While the ideal backup features of this configuration may then be lost, the old check drive/new data drive serves as a stopgap measure until a convenient time when the failed data drive can be replaced or brought on-line. In this way, the speed of the data drive configuration can be regained while data backup is carried out by any remaining check drives.

Hence, the invention is advantageous in that it provides a data protection scheme that allows failure of two data drives while still preserving the information stored on those data drives.

Another advantage of one embodiment of the invention is that it allows chaining back through a failed data drive such that data on yet another failed data drive can be recovered.

A further advantage of one embodiment of the invention is that it allows a designer to determine the preferred number of data drives that can be protected knowing the number of expected drive failures and the number of check drives used to protect an individual data drive.

Yet another advantage of one embodiment of the invention is that it can provide a data protection scheme which allows a check disk to be utilized as a data drive in place of an inaccessible data drive.

Other and further, advantages, and features of the invention will be apparent to those skilled in the art from a consideration of the following description taken in conjunction with the accompanying drawings wherein certain methods of an installation for practicing the invention are illustrated. However, it should be understood that the invention is not limited to the details disclosed but includes all such variations and modifications as fall within the spirit of the invention and the scope of the appended claims.

BRIEF DESCRIPTION OF THE DRAWINGS

FIG. 1 shows a configuration of data drives and check drives for providing backup functions.

FIG. 2 shows a flowchart for organizing drives in a sequential manner and allowing an ordinary write to a data drive as well as an ordinary read from a target data drive.

FIG. 3 shows a continuation of FIG. 2 to allow a write to a failed data drive and to allow a read from a failed data drive.

FIG. 4 shows a flowchart for a read or write when multiple drive failures occur.

FIG. 5 shows a configuration of data drives and check drives with a controller that allows recovery of lost data from a data drive.

FIG. 6 shows a flowchart for computing check information between two data drives.

FIG. 7 shows a chart of check drives associated with corresponding data drives that are used to compute check information for each check drive.

FIG. 8 shows the check drive sets for each check drive in FIG. 7.

FIG. 9 shows a flowchart for resurrecting lost data when a check drive and multiple data drives fail.

FIG. 10 shows a flowchart for computing the maximum number of data drives available when a given number (Z) of check drives are available, and when it is desired to allocate some number (P) of check drives for each data drive.

FIG. 11 shows a configuration of one embodiment of the invention that allows a set of D data drives to be configured with a controller and another set of P check drives.

FIG. 12 shows a flowchart for replacing a failed data drive with a functioning check drive such that the check drive can be redesignated as a data drive.

FIG. 13 shows a configuration in which a failed data drive D3 has been replaced with a functioning check drive P3.

FIG. 14 shows a set of rules which allow determination of the number of data drives that can be protected in a given configuration.

DETAILED DESCRIPTION OF THE PREFERRED EMBODIMENTS

FIG. 1 shows an embodiment of the invention that utilizes N data drives and N check drives. In this configuration, the N data drives are designated in a sequential order such that each of the N data drives has an associated preceding data drive and an associated succeeding data drive. For example, in FIG. 1, data drive 102 has preceding data drive 101 and succeeding data drive 103. Check information can be computed for each data drive. For example, in FIG. 1 check drive 201 holds parity information calculated by performing a parity computation utilizing data elements stored on data drives 101 and 102. Similarly, parity information can be stored on check drive 202 by calculating that parity information utilizing corresponding data blocks stored on data drives 102 and 103. This can continue for each of the N data drives wherein data drive 101 is considered a succeeding data drive to data drive 109. In this fashion parity information, for example, can be calculated between data drive 109 and data drive 101 and stored upon check drive 209 which is designated as storing parity information. Check information can be considered to mean information such as parity information that can be used to reconstruct data stored on a data drive. Similarly, the term data drive and disk drive are used interchangeably throughout this application. The term data drive is intended to encompass any data storage device even though disks are commonly used in current RAID systems. While many schemes might be used, a parity scheme would be a typical example. A person of ordinary skill in the art would recognize other check information schemes that could be utilized in addition to parity information.

FIG. 2 shows a flowchart for performing several different functions utilizing the configuration of FIG. 1. First, N data drives can be provided 301. The various N drives can be designated in a sequential order 302 as shown in FIG. 1. This particular order could be considered a sequential circular order. Check information can be calculated for each of the data drives, for example, check information can be computed between neighboring drives 303. After the check information is computed, the check information can be stored on the various check drives 304. For example, the check information computed between data drives 101 and 102 can be stored on check drive 201. Once the check drive information has been computed and the computer system is operating in its standard mode, resurrection functions can be implemented when a drive fails.

For example, in a typical operation which can be referred to as a normal read, a controller will receive a command 305 and determine if the command is a write command 306 or a read command 307. If the command is a read command, the controller can determine whether the target drive which data is to be read from is operative or available 320. If the target drive is determined to be available, then the data can be read from the target drive and passed back to the designated destination 321.

Similarly, if a normal write condition exists, then the controller will determine that a write command has been given 306 and will receive new data D2 for storage on the target data drive 308. A determination can then be made as to whether the target data drive is operative or available 309. In a normal write situation, the target data drive will be available. In this case, the new data can be written to the data drive and the corresponding check drives can be updated. For example, old data on the target data drive can be obtained 310. The corresponding existing check information on the check drives used to back up the target data drive also can be obtained 311. Using the old data stored on the target data drive and the check information stored on a check drive, interim check information can be calculated for use with the new data to be written to the target data drive. In the case of a parity scheme, the old data could be subtracted from the check information to obtain interim information. Then new check information can be calculated using the new data and the interim check information 313, for example, by adding the new data D2 to the interim check information The new check information can then be written to the check disk 314. Finally, the new data for storage on the target data disk can be written to the target data disk 315. Alternatively, as noted earlier, the new data for storage on the target data disk can be written to the target data disk and the recalculation of the check information for each check drive that backs up the target data disk can be performed. For example, in FIG. 1, if new data is to be written to data drive 102, parity information could be calculated using corresponding data blocks stored on data drives 101 and 102 for storage on check drive 201. Furthermore, the check information routine could be performed utilizing corresponding data blocks stored on data drive 102 and data drive 103 for storage of check information on check drive 202. Either way would allow updating of the check information whenever a write command for new data to be stored on a target data drive is performed.

FIG. 3 shows operation of one embodiment of the invention when a drive fails. If the command is determined to be a write command and to a disk which has failed, e.g., data block D2 is written to a failed drive, a corresponding data block D1 from an associated preceding data drive can be read 330. Then a second corresponding data block D3 from a succeeding data drive can be read 334. Utilizing D1 and D2, a first block of check information P1 can be calculated 335. Also, utilizing D3 and D2, a second block of check information P2 can be calculated 337. Check information P1 can be written to the check drive associated with the target drive and the preceding data drive. Similarly, check information P2 can be written to the check drive associated with the target drive and the succeeding data drive 341. This can be seen in FIG. 1. In the case where data drive 102 fails, the check drives 201 and 202 can be updated utilizing the data intended for target drive 102, that target drive's preceding data drive 101, and the target drive's succeeding data drive 103. While the data is not capable of being written to data drive 102 because that data drive has failed, the check information can be updated and used at a later date to recreate the data that is requested from failed data drive 102. In this fashion, the check drives serve to allow access to the data information should it be needed.

Similarly, when a drive fails and a read request is intended for a failed drive, the desired data can still be read. First, an active neighboring data drive of the target drive can be accessed 350. The active neighboring drive can be either a preceding or succeeding data drive of the target drive. This can be seen in FIG. 1 where the target drive, for example, could be data drive 102. Then, a check drive associated with the target drive and the neighboring data drive could be accessed 354. For example, check drive 201 could be accessed if data drive 101 is designated as the neighboring drive. Alternatively, check drive 202 could be accessed if data drive 103 is designated as the neighboring drive. Utilizing the data from the neighboring drive and information from the check drive, the lost data that was stored on the failed drive 102 could be calculated using a reverse-calculation of the check information, as a person of ordinary skill in the art would understand 358. For example, if a parity scheme were in use, one could subtract the known information on the neighboring drive from the information on the check drive to obtain the lost data of the target drive. Finally, with this recreated lost data, the lost data requested by the read command can be output 362.

One embodiment of the invention allows multiple drives to fail while still allowing reads and writes of the information designated for a failed drive to occur. For example, in FIG. 4, a write or read to or from a system with multiple failed drives can occur. N data drives can first be provided 400. These data drives can then be designated in a sequential order 404. Check information can be computed for neighboring drive 408 and the check information can be stored on designated check drives 412. When a read or write command is received 416, a determination can be made as to whether it is a write command 420 or a read command 424. If it is a write command, an active data drive is located 451, 452, 454. Then, data can be resurrected using drives associated with the active data drive to resurrect the data that was stored on a failed data drive 458. An unbroken string of check drives 455, 456 between the located active data drive and the failed data drive to which the write is being attempted allow this to occur. This process can be repeated until data for a target drive is recreated. Using the recreated data, check information on the associated check drive can be updated 466. For example, in FIG. 1, assuming that data drives 102 and 103 fail, data drive 104 can be considered an active drive that can be utilized to recalculate the data stored on data drive 103. This would be accomplished utilizing corresponding blocks of information on data drive 104 and check drive 203. In this fashion, the data information that previously had been stored on data drive 103 could be resurrected and held in memory of a computer or separate recovery drive. Then utilizing the resurrected data that had previously been stored on failed data drive 103 along with check drive 202, the information that had previously been stored on failed data drive 102 could be resurrected as well. Then, utilizing the data intended for storage on data drive 102, the check drives 201 and 202 could be updated as described earlier. In this fashion, this embodiment of the invention allows chaining back through multiple failed data drives utilizing existing check information and existing operative data drives to resurrect failed data drive information and to update check drives associated with a failed data drive.

Similarly, when a read command is issued to a data storage system that has multiple failed drives, a read command is first determined 424, and a determination is made as to whether the target data drive from which data is to be read is available 428. If the determination is made that the target drive is not available, an active data drive that neighbors a failed data drive can be located 429, 430, 432. An unbroken string of check drives 433, 434 between this active data drive and the failed data drive from which the read is being attempted allow this to occur. Using the information on the active data drive and a corresponding check drive, data on the associated failed target data drive can be resurrected 436. This can be accomplished by utilizing the active data drive information and the active check drive information on the failed drive which is associated with both the active data drive and the active check drive. This process can be repeated until data for the target data drive is resurrected as well 440. Finally, the resurrected data can be output to the host or controller 440. Thus, when multiple drives fail, a chaining back through the configuration of the data and check drives allows data to be resurrected, assuming that the check routine is known. Note that up to one half of the drives in the data set can fail, provided that at least one data drive remains available and an unbroken string of check drives exists between each failed data drive and some available data drive.

FIG. 5 shows an embodiment of the invention in which an array of N data drives are configured in a sequential order such that each of the N data drives has an associated preceding data drive and an associated succeeding data drive. In this figure, the Nth data drive is considered to be preceding the first data drive 101. A means for computing check information 300 is shown such that check information can be computed between each data drive and each corresponding preceding data drive. The means for computing could be a microprocessor or other device capable of carrying out the routine, such as a parity routine. A set of N check drives are also shown in FIG. 5 on which the computed check information can be stored. The computed check information for each set of data drives can be stored on a separate one of the N check drives. For example, the check information computed using data drives 101 and 102 can be stored on check drive 201 while the check information calculated using the data stored on data drives 102 and 103 can be stored separately on check drive 202.

To calculate check information a simple routine such as that in FIG. 6 can be utilized in the various embodiments. For example, in FIG. 5 data can be stored on data drive 102. The data can be obtained and referred to as D2 500. Then, associated data on data drive 101 can be obtained and referred to as D1 504. Utilizing D1 and D2, check information P1 can be calculated 508. The check information P1 can then be stored on the check drive 201 which is associated with data drives 101 and 102 where D1 and D2 are stored 512.

One embodiment of this invention permits the use of N data drives with P check drives where P is less than N. This embodiment is more cost effective due to the lower percentage of check drives required. This embodiment begins by describing a rule-based method. In this method, the data drives can be provided with each data drive configured for storing data. Each data drive will be protected with a set of at least two check drives. The drives can be configured such that a set of at least two check drives is established and has no more than one check drive in common with every other individual set of at least two check drives. This can be seen in FIG. 7 in which six check drives P1 through P6 are listed. The various data drives assigned to each check drive are then shown below each check drive. As can be seen in FIG. 7, no two check drives have more than one common data drive. For example, the various check drive sets are shown in FIG. 8. In FIG. 8, the P1 check set has data drives D1 through D5, whereas the P2 set has data drives D1, D6, D7, DB, and D9.

Only the drive D1 is shared between check drive sets P1 and P2. Therefore, should drives D1 and D2 fail, the check drive set of P1 would be unable to recalculate the lost information. However, check drive set P2 which does not include data drive D2 would allow recreation of the data stored on data drive D1. Then, data drive D2 could be reconstructed in one of two ways: 1) Use the reconstructed data for D1 and check set P1 or 2) Use check set P3.

Therefore, as can be seen in FIGS. 7, 8, and 9 when all the data drives in a check set fail along with the check drive, the data can still be accessed. This configuration therefore allows recovery of data when one data drive fails or a plurality of drives fail as in the situation where check drive set P1 fails. Should a single or more than one check drive fail, there is no impact on the data of the data drives since those drives hold only check information. Therefore, the important data on the data drives can still be accessed for output through normal read and write commands.

FIG. 10 shows a method for another embodiment of the invention that utilizes D data drives and P check drives where the number of check drives assigned to back up a single one of the D data drives can be referred to or is known and referred to as Z. In this method one would utilize D data drives 600. Then, one could establish a minimum number Z for the quantity of check drives to be used to back up a data drive 604. Then, utilizing P check drives to back up the data 608, one could select D and P such that they satisfy the relationship $D<(P!)/((z!)*(P-Z)!)$ 612. Once this configuration is established, one could provide data backup for failure of any two drives 616. FIG. 11 shows this embodiment with controller 700 and network 704 coupling the D set of data drives 108 to a set of P check drives 712.

When an underlying RAID-4 or RAID-5 method is used and given that we supply multiple parity drives, the efficient way to protect against multiple drive failures can be summed up in the rules shown in FIG. 14, where (1) Every data drive needs to be protected by two different check drives (at least), and (2) No two data drives can rely on the exact same set of check drives. In FIG. 14, let "Dn" signify "Data Drive n", "Px" signify "Check drive x", "→" signify "calculates check information to", "Dn→Px" signify "Data Drive n is (one of the drives) protected by check drive x."

FIG. 12 shows a method of reconfiguring a backup system should a drive fail. Oftentimes, it is important to keep a storage system online rather than immediately servicing it when a data drive is lost. There will be preferred times and significantly less preferred times to replace a failed data drive. Therefore, it is important to be able to implement a temporary solution when a data drive fails until a more optimum time can be reached to actually replace the failed data drive. This embodiment of the invention involves providing at least one data drive to store data 750 providing at least one such drive to back up the data 754. Once a failed data drive is detected 758, the information on the failed data drive can be recreated 762. The recreated data can then be copied to what was previously a check drive 764. Then, the check drive can be given the designation of the failed data drive 768. Finally, the system can be placed in operation such that any previous command directed to the failed data drive is now directed to the previous check drive. While the backup of the system may be affected by this reconfiguration, this method provides a temporary solution when a data drive fails. Since it is often necessary to perform multiple writes when a data drive fails, this implementation may save time by replacing the failed data drive with a check drive and thereby eliminating the need for a second write command. Therefore, while backup ability might be harmed, the speed of operation is facilitated.

FIG. 13 shows a configuration that can be used to implement this scheme. Data drives 811, 812 and 813 represent the intended data drives on which information is to be stored. Check drives 801, 802 and 803 designate the check drives on which the data drives are backed up. The "X" drawn through data drive 813 indicates that it has failed. The "X" drawn through P3 on drive 803 indicates that it previously was check information, and the designation D3 on drive 803 indicates that it is data information that has been stored on drive 803 and was either moved from or resurrected from failed data drive 813. A controller or computer such as computer 800 can be utilized to control the various drives.

The invention is unique in that several embodiments can utilize two separate check drives that are independent from the data drives. This can be important because it facilitates the accessing of the data disks and the storage of information on the storage system. For example, RAID 6 distributes parity information on the data drives requiring a very complicated controller to access the various drives. The present invention overcomes this disadvantage by providing separate check disks that do not involve complicated addressing. Furthermore, by using check drives that are separate, a loss of a data drive does not also result in loss of check information.

It is thought that the apparatuses and methods of the embodiments of the present invention and many of its attendant advantages will be understood from the foregoing description and it will be apparent that various changes may be made in the form, construction, and arrangement of the parts thereof without departing from the spirit and scope of the invention or sacrificing all of its material advantages, the form hereinbefore described being merely a preferred or exemplary embodiment thereof.

What is claimed is:

1. A method of providing data backup in a computer system, comprising:
   a) providing N data drives, wherein N is an integer greater than 2;
   b) designating the N data drives in a sequential order such that each of the N data drives has an associated preceding data drive and an associated succeeding data drive, wherein the Nth data drive is considered to be preceding the first data drive;
   c) computing check information between each data drive and each corresponding preceding data drive; and
   d) storing the Check Information computed between each data drive and each corresponding associated preceding data drive on one of N check drives such that each computed Check Information is stored on a separate one of said N check drives.

2. The method of providing data backup in a computer system as described in claim 1 and further comprising:
   receiving new data for storage on a target data drive;
   obtaining old data stored on the target data drive;
   obtaining existing Check Information stored on a check drive;
   utilizing the old data to reverse-calculate Interim Check Information from the existing Check Information;
   utilizing the new data and the Interim Check Information to determine New Check Information;
   writing the New Check Information to the check disk; and
   writing the new data to the target data disk.

3. The method of providing data backup in a computer system as described in claim 1 and further comprising:
   determining that a target data drive has failed;
   accessing an associated preceding data drive of the target drive;
   accessing a check disk associated with the target data drive and the associated preceding data drive of the target drive; and
   calculating lost data that was originally stored on the target data drive by using information stored on the associated preceding data drive of the target drive and information stored on the check disk associated with the target data drive and the associated preceding data drive of the target drive.

4. The method of providing data backup in a computer system as described in claim 1 and further comprising:
   determining that a target drive has failed;
   accessing an associated succeeding data drive of the target drive;
   accessing a check disk associated with the target data drive and the associated succeeding data drive of the target drive; and
   calculating lost data that was originally stored on the target data drive using information stored on the associated succeeding data drive of the target drive and information stored on the check disk associated with the target drive and the associated succeeding data drive of the target drive.

5. The method of providing data backup in a computer system as described in claim 1 and further comprising:
   attempting to write a data block D2 to a target data drive;
   determining that the target data drive has failed;
   reading a first corresponding data block D1 from an associated preceding data drive;
   reading a second corresponding data block D3 from an associated succeeding data drive;
   calculating a first block of Check Information P1 using the data block D2 and the first corresponding data block D1;
   calculating a second block of Check Information P2 using the data block D2 and the first corresponding data block D3;
   writing the first block of Check Information P1 to a first check disk associated with the target data drive and the associated preceding data drive; and
   writing the second block of Check Information P2 to a second check disk associated with the target data drive and the associated succeeding data drive.

6. The method of providing data backup in a computer system as described in claim 1 and further comprising:
   attempting to write a data block D2 to a target data drive;
   determining that the target data drive has failed;
   reading a first corresponding data block D1 from an associated preceding data drive of the target data drive;
   calculating a first corresponding block of check disk information P1 using D1 and D2;
   writing P1 to a first check disk associated with the target data drive;
   attempting to read a second corresponding data block D3 from an associated succeeding data drive of the target data drive;
   determining that the associated succeeding data drive of the target data drive has failed;
   reading a third corresponding data block D4 from a data drive that is associated with the associated succeeding data drive of the target data drive;

reading a fourth corresponding data block P3 from a check disk that is associated the data drive that is associated with the associated succeeding data drive of the target data drive and the succeeding data drive of the target data drive;

calculating D3 utilizing P3 and D4;

calculating a second corresponding block of check disk information P2 utilizing D2 and D3; and writing P2 to a second check disk associated with the target disk.

7. The method of providing data backup in a computer system as described in claim 1 and further comprising:

attempting to write a data block D2 to a target data drive;

determining that the target data drive has failed;

attempting to access at least one associated data drive that neighbors the target data drive;

determining that the associated data drive that neighbors the target data drive has failed;

utilizing an existing active data drive and existing active check drives to chain back so as to resurrect lost data on the failed drives; and utilizing the resurrected lost data and a check disk associated with the target data drive to update the target data drive.

8. The method of providing data backup in a computer system as described in claim 1 and further comprising:

attempting to read a data block D2 from a target disk;

determining that the target disk has failed;

attempting to access at least one data drive that is associated with the failed target disk;

determining that the data drive associated with the failed target disk has also failed; and utilizing existing active data drives and existing active check drives to chain back so as to resurrect lost data on the target disk.

9. An apparatus to provide data backup in a computer system, comprising:

a) an array of N data drives, wherein N is an integer greater than 2, configured in a sequential order such that each of the N data drives has an associated preceding data drive and an associated succeeding data drive, wherein the Nth data drive is considered to be preceding the first data drive;

b) a means for computing Check information between each data drive and each corresponding preceding data drive; and c) a set of N check drives on which computed Check Information between each data drive and each corresponding associated preceding data drive can be stored, said set of N check drives configured such that each computed Check Information can be stored on a separate one of said N check drives.

10. A method of providing data backup in a computer system, comprising:

a) providing D data drives, wherein D is an integer greater than 2, each data drive configured for storing data;

b) protecting each data drive with a set of at least two separate check drives; and c) establishing each set of at least two check drives such that each set of at least two check drives has no more than one check drive in common with every other individual set of at least two check drives.

11. The method of providing data backup in a computer system as described in claim 10 and further comprising providing data backup when all drives associated with a check drive and the check drive fail.

12. The method of providing data backup in a computer system as described in claim 10 and further comprising providing data backup when at least one drive fails.

13. The method of providing data backup in a computer system as described in claim 12 and further comprising providing data backup when a plurality of drives fail.

14. The method of providing data backup in a computer system as described in claim 10 and further comprising providing backup when a plurality of drives fail.

15. The method of providing data backup in a computer system as described in claim 14 and further comprising providing backup when one data drive and one check drive fail.

16. The method of providing data backup in a computer system as described in claim 10 and further comprising providing data backup when two data drives fail.

17. The method of providing data backup in a computer system as described in claim 10 and further comprising providing data backup when two check drives fail.

18. An apparatus to provide data backup in a computer system, comprising:

a) an array of D data drives, wherein D is an integer greater than 2, each data drive configured for storing data; and b) a set of at least two check drives coupled to each of said D data drives and separate from the D data drives;

wherein each set of at least two check drives has no more than one check drive in common with every other individual set of at least two check drives.

19. The apparatus to provide data backup in a computer system as described in claim 18 and further comprising a means for providing data backup when all data drives associated with a check drive and the check drive fail.

20. The apparatus to provide data backup in a computer system as described in claim 18 and further comprising a means for providing data backup when at least one data drive fails.

21. The apparatus to provide data backup in a computer system as described in claim 20 and further comprising a means for providing data backup when a plurality of drives fail.

22. The apparatus to provide data backup in a computer system as described in claim 18 and further comprising a means for providing data backup when a plurality of drives fail.

23. The apparatus to provide data backup in a computer system as described in claim 22 and further comprising a means for providing backup when one data drive and one check drive fail.

24. The apparatus to provide data backup in a computer system as described in claim 18 and further comprising a means for providing data backup when two data drives fail.

25. The apparatus to provide data backup in a computer system as described in claim 18 and further comprising a means for providing data backup when two check drives fail.

26. A method of providing data backup in a computer system, the method comprising:

a) utilizing D data drives, wherein D is an integer greater than 2;

b) establishing a minimum number Z for the quantity of check drives to be used to backup a data drive;

c) utilizing P check drives to backup data;

d) selecting D and P such that they satisfy the relationship: $D < (P!)/((Z!)*(P-Z)!)$; and e) providing data backup in the computer system for the failure of any two drives in a set of drives comprising all D of the data drives and all P of the check drives.

27. An apparatus to provide data backup in a computer system, the apparatus comprising:
   a) a plurality of D data drives, wherein D is an integer greater than 2; and
   b) a set of P check drives to backup data, the set of P check drives separate from the D data drives such that loss of one of said D data drives does not result in loss of Check Information stored on one of said P check drives, the check drives coupled to the array of D data drives such that each one of said D data drives is backed up by Z check drives;

wherein D, P and Z satisfy the relationship: $D<(P!)/((Z!)*(P-Z))!$ and wherein D and P are coupled such that data backup can be provided for the failure of any two drives in a set of drives comprising all D of the data drives and all P of the check drives.

* * * * *